United States Patent [19]

Mitsui et al.

[11] Patent Number: 4,915,894
[45] Date of Patent: Apr. 10, 1990

[54] AROMATIC POLYIMIDE FILM AND PROCESS FOR THE PREPARATION OF THE SAME

[75] Inventors: Kazuhiko Mitsui; Kenji Kuniyasu; Toshiyuki Nishino, all of Ube, Japan

[73] Assignee: Ube Industries, Ltd., Ube, Japan

[21] Appl. No.: 234,797

[22] Filed: Aug. 22, 1988

[30] Foreign Application Priority Data

Aug. 21, 1987 [JP] Japan .................. 62-209075

[51] Int. Cl.$^4$ .............................. B29D 7/00
[52] U.S. Cl. .................. 264/212; 428/473.5; 428/910
[58] Field of Search ............ 428/473.5, 910; 264/212

[56] References Cited

U.S. PATENT DOCUMENTS 4,725,484 2/1988 Kumagawa ............... 428/473.5

Primary Examiner—Marion C. McCamish
Attorney, Agent, or Firm—Frishauf, Holtz, Goodman & Woodward

[57] ABSTRACT

Disclosed is an aromatic polyimide film which is well resistant to sagging and dimensional change in the heat treatment. The aromatic polyimide film is formed from a polymer solution which is produced by a polymerization reaction of a biphenyltetracarboxylic acid component and a phenylenediamine component, and characterized in that any rectangle optionally supposed within the film has a ratio between a length of any side and a length of the central portion between the side and a side opposite thereto is in the range of 100:100 to 100:100.15, and a heat shrinkage ratio of the film is not more than 0.3% (0.003) in any direction after the film is heated at 300° C. for 2 hours. A process for the preparation of the above aromatic polyimide film is also disclosed.

10 Claims, 2 Drawing Sheets

AROMATIC POLYIMIDE FILM AND PROCESS FOR THE PREPARATION OF THE SAME

BACKGROUND OF THE INVENTION

1. Field of the Invention

The present invention relates to an aromatic polyimide film and a process for the preparation of the same. More particularly, the invention relates to an aromatic polyimide film which is resistant to sagging and has excellent surface conditions (highly plane surface) as well as producing less dimensional change after heat treatment, and a process for the preparation of the same.

2. Description of Prior Art

Since a previously known aromatic polyimide film such as prepared using a pyromellitic acid shows poor dimensional stability when it is heated, extremely heavy curling is brought about when the film is combined with other material such as a copper foil at high temperatures. For this reason, there has been proposed a method of performing a stretching treatment (i.e., orientation) in the film-forming process to reduce the curling (Japanese Patent Publication No. 44(1969)-20878).

Recently, an aromatic polyimide film originating from a polymer (i.e., polyamic acid) produced by polymerization reaction of a biphenyltetracarboxylic acid component such as 3,3',4,4'-biphenyltetracarboxylic dianhydride and a phenylenediamine component such as p-phenylenediamine has been developed and confirmed to have a low linear expansion coefficient. Accordingly, a polyimide film of this type is expected to show less curling. However, the aromatic polyimide film is insufficient in the dimensional stability under application of heat, though heavy curling can be avoided, so that various problems still remain. For example, when the aromatic polyimide film is combined with other thin film such as a ceramic film or a conductive metal foil to prepare a composite material (i.e., laminate material, the polyimide film easily deforms in the heating process such as an etching process and a soldering process.

In view of the above-mentioned problem, there has been proposed processes for the preparation of an aromatic polyimide film in which dimensional change is hardly brought about even after the heat treatment, as described in U.S. Pat. No. 4,725,484.

The processes described in the above U.S. Patent are developed for solving the aforementioned drawback, that is, solving the problem of dimensional change. One process described in the U.S. Patent comprises the steps of drying a thin film of a polyamic acid solution coated over a support to to obtain a solid film (namely, a film containing a small amount of a solvent), then heating the film to further dryness under the condition that both end portions of the film in the longitudinal direction are fixed to obtain an aromatic polyimide film, and finally again heating the resulting polyimide film at a high temperature under weak tension to mitigate the stress produced in the imidation reaction.

In another process described in the U.S. Patent, the drying process of a thin film of a polyamic acid solution formed on a support is performed slowly in two stages, that is, a first stage of drying the thin film with the support and a second stage of drying the thin film after separation from the support under weak tension, to obtain a solid film which is reduced in occurrence of stress. Thereafter, the resulting film is finally heated to dryness to perform imidation reaction under the condition that at least a pair of end portions of the film are fixed.

By conducting the above-mentioned heat treatments described in the U.S. Patent, the aromatic polyimide resin film is prominently enhanced in the dimensional stability in the heating process. However, the present inventors have found that the side edge portions of the film in the transverse direction are put under restraints but the central portion of the film in the same direction is placed under no specific restraint in the final heating procedure, namely, the heating procedure of mitigating the stress to fix the film form in the former process or the heating procedure of restraining the stress to fix the film form in the latter process, and hence the film form is fixed under such condition that a difference is given between the side edge portion of the film and the central portion thereof with respect to the shrinkage rate in the longitudinal direction. It has been confirmed that the shrinkage of the side edge portion of the film in the longitudinal direction is larger than that of the central portion in the same direction, whereby sagging is easily brought about in the central portion of the film. The occurrence of such sagging causes a problem of non-uniform adhesion to other material in the case of using the aromatic polyimide film for producing the aforementioned composite material (i.e., laminate material). Accordingly, it is eagerly required to prevent occurrence of sagging in the aromatic polyimide film.

SUMMARY OF THE INVENTION

It is an object of the present invention to provide an aromatic polyimide film which is reduced in occurrence of sagging and has excellent surface condition as well as produces less dimensional change even after subjected to a heat treatment and a process for the preparation of the same.

There is provided by the present invention an aromatic polyimide film formed from a polymer solution which is produced by a polymerization reaction of a biphenyltetracarboxylic acid component and a phenylenediamine component, in which a rectangle optionally supposed within said film has a ratio between a length of any side and a length of the central portion between said side and a side opposite thereto is in the range of 100:100 to 100:100.15, and a heat shrinkage rate of said film is not more than 0.3 % (namely, 0.003) in any direction after said film is heated at 300° C. for 2 hours.

An example of the "rectangle optionally supposed within the film" is illustrated in FIG. 1.

The above-mentioned aromatic polyimide film hardly suffering troublesome sagging and dimensional change in a heat treatment can be readily prepared by the process of the invention comprising:

a first step of heating an aromatic polyimide continuous film formed from a polymer solution (in which the polymer is produced by a polymerization reaction of a biphenyltetracarboxylic acid component and a phenylenediamine component), at a temperature of 400° to 500° C. under the condition that said film is extended by applying thereto a tension of 100 to 400 g/mm$^2$ in the longitudinal direction, and a second step of heating said aromatic polyimide continuous film at a temperature of 250° to 400° C. under a tension of 50 to 100 g/mm$^2$ in the longitudinal direction without essentially extending said film.

The aromatic polyimide film of the present invention shows a high dimensional stability under application of heat, and is prominently reduced in the occurrence of sagging (that is, there is almost no difference between the length on both sides and the length of the central portion thereof) to show a highly plane surface. Owing to such excellent surface condition and high dimensional stability under application of heat, the aromatic polyimide film of the invention can be very advantageously employed as a material of an electronic component, a substrate of a precision component, etc. such as a flexible printable board with high precision and a carrier tape which require highly plane surface and high dimensional stability under application of heat in the preparation thereof or usage thereof.

The above-mentioned aromatic polyimide film of the invention can be readily prepared by the process comprising the steps of heating and stretching (orientating) the film to remove the sagging of the central portion of the film and further heating the film to fix (stabilize) the film form.

DETAILED DESCRIPTION OF THE INVENTION

Figure 1:
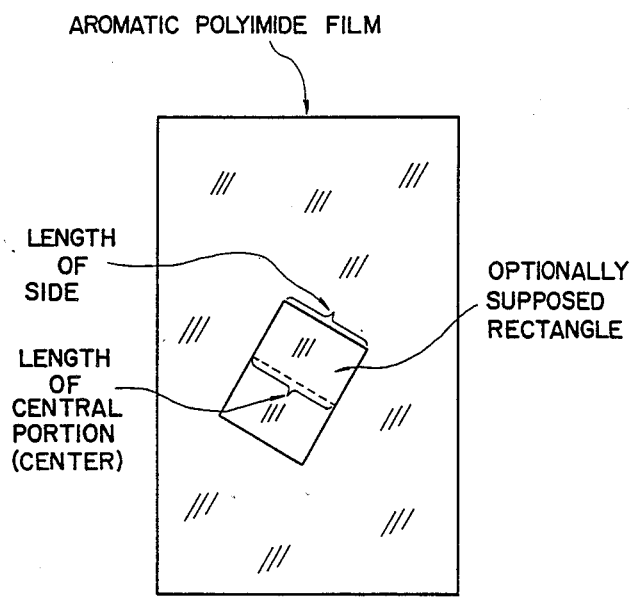
FIG. 1 is a schematic view illustrating an example of the rectangle optioannly supposed within the film.

The aromatic polyimide film of the present invention is formed from a polymer solution containing a polyamic acid (i.e., polyimide precursor) homogeneously dissolved in an organic polar solvent, said polyamic acid being produced by a polymerization reaction of a biphenyltetracarboxylic acid component and a phenylenediamine component. In the preparation of the aromatic polyimide film, the polymer solution is used as a film-forming dope solution, and the polymer solution is subjected to a film-forming procedure and an imidation reaction to prepare a film of aromatic polyimide. Thus prepared aromatic polyimide film of the invention has excellent surface condition (i.e., highly plane surface) and produces little dimensional change even after it is subjected to a heat treatment.

Examples of the biphenyltetracarboxylic acid components include 3,3',4,4'-biphenyltetracarboxylic acid and 2,3,3',4'-biphenyltetracarboxylic acid; and their derivatives such as acid dianhydrides thereof, esters thereof and acid halides thereof. Preferred are acid dianhydrides.

Examples of the phenylenediamine components include o-, m- or p-phenylenediamine. Preferred is p-phenylenediamine.

The aromatic polyimide film of the invention is mainly composed of the above-mentioned biphenyltetracarboxylic acid component and phenylenediamine component, and contains a repeating unit in an amount of more than 90 molar %, preferably more than 95 molar %, said repeating unit having the formula (I):

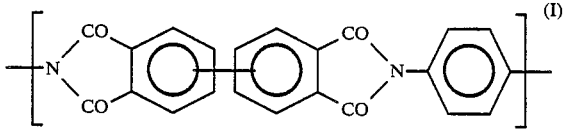

In addition to the above-mentioned biphenyltetracarboxylic acid component and phenylenediamine component, the aromatic polyimide film of the invention may contain other aromatic tetracarboxylic acid components and other aromatic diamine components in an amount of less than 10 molar %, preferably less than 5 molar %, respectively.

The aromatic polyimide film of the invention is a film formed from the above-mentioned aromatic polyimide. Further, when an optical rectangle is supposed in the film, a sagging rate is not more than 0.15% (0.0015), preferably not more than 0.1% (0.001), in the direction along any side of the supposed rectangle. The term "sagging rate" used herein means a ratio of the length of any optional side of the rectangle to the length of the imaginary center line supposed between said side and an opposite side thereto. Furthermore, the heat shrinkage rate of the film is not more than 0.3% (0.003), preferably not more than 0.2% (0.002), in any direction of the longitudinal direction and the transverse direction after the film is heated at 300° C. for 2 hours.

In the invention, the above-mentioned sagging rate is measured as follows. In the first place, the aromatic polyimide film of a rectangular form (1 m × 2 m) is cut at the center (i.e., center cut) in parallel with the side edge lines. The film is then fixed along the formerly side edge line, and a weight of 160 g is attached to its lower part to make the new side lines straight. In the second place, a point on the film which is distant from the upper end on the straight side edge line by 1.73 m is marked to determine a starting point, and from the starting point a line parallel with the upper edge line of the film (i.e., reference line) is drawn on the film. Then, the film is cut in the direction perpendicular to the reference line to give strips of 5 cm wide. The strip corresponding to the formerly central portion of the film is fixed at the upper end and allowed to stand with a weight of 160 g. attached to its lower end. When sagging of the film strip diminishes, the length between the upper end and the reference line is measured. Thus measured length of the film strip (which corresponds to the central portion of the uncut film) is set to be "x" meter, and then the sagging rate is determined by the following equation.

$$\text{Sagging rate }(\%) = (x - 1.73)/1.73 \times 100$$

An aromatic polyimide film employable for the preparation of the aromatic polyimide film of the invention which less suffers occurrence of sagging and shows a high dimensional stability under application of heat can be produced by any of conventional film-forming processes, provided that the film is prepared by using a biphenyltetracarboxylic acid component and a phenylenediamine component. For example, an aromatic polyimide film formed by the following film-forming process can be favorably employed in the invention.

In the first place, an aromatic tetracarboxylic acid component preferably contining the aforementioned biphenyltetracarboxylic acid component in an amount of more than 90 molar %, more preferably more than 95 molar %, and an aromatic diamine component containing the aforementioned phenylenediamine component in an amount of more than 90 molar %, more preferably more than 95 molar %, are added to an organic polar solvent at substantially equivalent mole(s) to each other to perform a polymerization reaction at a temperature of preferably not higher than 100° C., more preferably not higher than 80° C., so as to prepare a polymer solution containing an aromatic polyamic acid (i.e., aromatic polyimide precursor) homogeneously dissolved in the organic polar solvent. The obtained polymer solution is used as a film-forming dope solution.

The above-mentioned aromatic polyamic acid preferably has a logarithmic viscosity (temperature: 30° C., concentration: 0.5 g/100 ml-solvent, solvent: N-methyl-2-pyrrolidone) of 0.1 to 5, more preferably 0.2 to 4. The above-mentioned polyamic acid solution preferably has a polymer concentration of 2 to 40 wt.%, more preferably 3 to 30 wt.%, and preferably has a viscosity (measured by a rotary viscometer at 30° C.) of 10 to 50.000 poise.

The above-mentioned organic polar solvent can be used as a polymerization solvent or a solvent for a film-forming dope solution, and any polar solvent can be used, so far as the solvent homogeneously dissolved therein the aforementioned each monomer component and polyamic acid. Examples of the organic polar solvents preferably employable in the invention include amide solvents such as N,N-dimethylsulfoxide, N,N-dimethylformamide, N,N-diethylformamide, N,N-dimethylacetamide, N,N-diethylacetamide, N-methyl-2-pyrrolidone and hexamethylenephospholamide, pyridine, dimethylsulfoxide, tetramethyl urea, cresol and phenol.

In the second place, the above-obtained dope solution (polyamic acid solution) is cast over an appropriate support having a smooth surface such as a drum or belt made of a metal to form thereon a thin film of the dope solution having a uniform thickness, and the thin film on the support is then heated to a temperature of preferably 40° to 180° C., more preferably 50° to 150° C., to evaporate the solvent contained in the thin film, so as to prepare a solid film of continuous form containing the solvent in an amount of 20 to 60 wt.%, preferably 30 to 50 wt.%.

Subsequently, the continuous solid film is separated from the support, and the film is heated to dryness at a temperature of 200° to 500° C., preferably 250° to 450° C., for 1 to 200 minutes, preferably 2 to 100 minutes, to perform imidation reaction under the condition that at least a pair of end or side portions of the film are fixed. Thus, a polyimide film of continuous form is prepared. In the above-described heating procedure, it is preferred that the film is throughly dried and the imidation reaction is sufficiently carried out so that the total amount of the remaining solvent and the water content produced by the imidation reaction contained in the resulting film would be not more than 1 wt.%.

The device preferably employable for fixing the continuous solid film is provided with pairs of members in the form of belt or chain which are equipped with a number of pins, clips or the like arranged at the same intervals along the both side edges in the longitudinal direction of the film. The device is preferably movable together with the film. Further, the device for fixing the film may be capable of extending or contracting the continuous film in the transverse directon or the longitudinal direction at a rate of preferably 0.5 to 5% (0.005 to 0.05 ) in the heating process.

Then, the above-obtained aromatic polyimide film is subjected to the heating process which comprises:

a first step of heating the aromatic polyimide film at a temperature of 400° to 500° C. under the condition that the film is extended at a rate of 0.2 to 0.4% by applying a tension of 100 to 400 g/mm² in the longitudinal direction, and a second step of heating the aromatic polyimide film at a temperature of 250° to 400° C. under tension of 50 to 100 g/mm² in the longitudinal direction with no substantial extension of the film.

Thus, an aromatic polyimide film which is reduced in to occurrence of sagging and has excellent surface conditions as well as is reduced in dimensional change even after the heat treatment is obtained.

Figure 2:
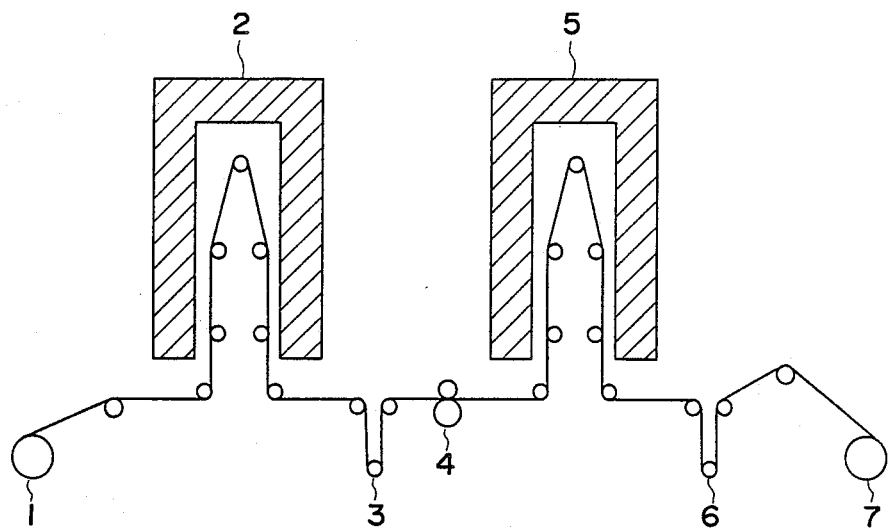
FIG. 2 is a schematic view illustrating an example of a device employable for the heating treatment in a process for the preparation of an aromatic polyimide film of the invention.

The attached FIG. 2 is a schematic view illustrating the steps of heating treatment of the aromatic polyimide film according to the above-mentioned process.

In the first step, the aimed polyimide film wound around a roll 1 moves into a heating furnace 2 for removing sagging of the film. In the heating furnace 2, the film is heated at a temperature of 400° to 500° C. (preferably 410° to 500° C.) under the condition that the film is extended (preferably at an extension rate of 0.2 to 0.4%) by applying a tension of 100 to 400 g/mm² (preferably 150 to 300 g/mm²) by means of a dancer roll 3. In this heat treatment, the length of side edge portion of the film in the longitudinal direction is made to substantially coincide with the length of the central portion of the film in the same direction, and thus adjusted shape of the film is fixed (stabilized) to remove the sagging of the film.

For stabilizing the shape of the aromatic polyimide film extended in the above-specified range, the above-described heating procedure is generally conducted for 0.1 to 10 minutes, preferably 0.5 to 5 minutes, at the above-mentioned temperature.

In the second step, aromatic polyimide film is temporarily liberated from the tension applied in the first step by means of a nip roll 4, and then the film moves into a heating furnace 5 for mitigating stress. In the heating furnace 5, the film is heated at a temperature of 250° to 400° C. (preferably 270° to 370° C.) under tension of 50 to 100 g/mm² (preferably 60 to 90 g/mm²) by means of a dancer roll 6 without substantially extending the film. In this heat treatment, the remaining stress having been produced in the imidation procedure and the first heating step is mitigated. The film having been subjected to the heat treatment for mitigating the stress is finally wound up around a roll 7.

Examples of the present invention and comparison examples are given below.

EXAMPLE 1

Into a simple polymerization reactor of 50 l were successively charged 38.1 kg. of N,N-dimethylacetamide and 5.2959 kg. of 3,3',4,4'-biphenyltetracarboxylic dianhydride. To the resulting mixture was then slowly added 1.9466 kg. of p-phenylenediamine under stirring, to perform a polymerization reaction of the aromatic tetracarboxylic acid component acid component and the aromatic diamine component at 30° C. for 10 hours so as to prepare a polymer solution of an aromatic polyamic acid (i.e., film-forming dope solution).

The logarithmic viscosity of the polyamic acid produced by the above polymerization reaction was 3.10 (at 30° C.), and the viscosity (measured by a rotary viscometer at 30° C.) of the polyamic acid solution (dope solution) was approx. 25,000 poise.

The obtained dope solution was continuously extruded over a smooth surface of a metal belt at approx. 30° C. from a slit (lip interval: 0.5 mm, lip width: 650 mm) of a T-die to form a thin film of the dope solution on the belt. The thin film on the belt was dried by applying a hot air of approx. 120° C. to form a solid film of continuous form. Then, the continuous solid film was separated from the belt and placed in a high-temperature heating furnace. In the heating furnace, the continuous film was heated to dryness and subjected to imidation reaction by applying a hot air having a temperature gradually rising from approx. 250° to 450° C., moving the film under the condition that the film was fixed at the both end portions in the longitudinal direction by means of a transverse tenter. Thus, an aromatic polyimide film was prepared.

Subsequently, the obtained aromatic polyimide film of continuous form was extended under heating to remove sagging of the central portion of the film and then further heated to fix the film shape in a heating device as shown in FIG. 2. In more detail, the aromatic polyimide continuous film was unfixed from the tenter. The continuous film was then supplied in a high-temperature heating furnace of longitudinal type (first heating furnace) under the condition that the film was extended in the longitudinal direction of the film by applying a tension of 160 g/mm² by means of a dancer roll, and heated at 414° C. for 2 min. in the first heating furnace to remove sagging of the aromatic polyimide film. Thereafter, the aromatic polyimide film was temporarily liberated from the above-mentioned tension by means of a nip roll, and then supplied in a high-temperature heating furnace of longitudinal type (second heating furnace) under tension of 80 g/mm² by means of a dancer roll. In the second heating furnace, the aromatic polyimide film was heated at 332° C. for 2 minutes to mitigate the stress.

The physical properties of the resulting aromatic polyimide film are set forth in Table 1.

EXAMPLE 2

The procedures of Example 1 were repeated except for performing the heat treatment for mitigating the stress at 278° C. for 2 minutes, to obtain an aromatic polyimide film.

The physical properties of the resulting aromatic polyimide film are set forth in Table 1.

Comparison Example 1

The procedures of Example 1 were repeated except for not performing the heat treatment for removing the sagging of the film, to obtain an aromatic polyimide film.

The physical properties of the resulting aromatic polyimide film are set forth in Table 1.

Comparison Example 2

The procedures of Example 1 were repeated except for not performing the heat treatment for removing the sagging of the film and performing the heat treatment for mitigating the stress at 286° C. for 2 min. in the second heating furnace under tension of 80 g/mm² in the longitudinal direction of the film by means of a dancer roll, to obtain an aromatic polyimide film.

The physical properties of the resulting aromatic polyimide film are set forth in Table 1.

TABLE 1

|  | Heat Shrinkage Rate (%) | | | | Sagging Rate (%) | |
|---|---|---|---|---|---|---|
|  | Side edge | | Center | | | |
|  | MD | TD | MD | TD | MD | TD |
| Example 1 | 0.07 | 0.01 | 0.02 | 0.02 | 0.01 | 0 |
| Example 2 | 0.11 | 0.01 | 0.02 | 0.02 | 0 | 0 |
| Com. Ex. 1 | 0.06 | 0.01 | 0.02 | 0.02 | 0.14 | 0 |
| Com. Ex. 2 | 0.14 | 0.09 | 0.04 | 0.10 | 0.16 | 0 |

Remarks:
Heat shrinkage rate: shrinkage rate of the film after heating the film at 300° C. for 2 hours.

MD for heat shrinkage rate was measured in the longitudinal direction (running direction) of the film.

TD for heat shrinkage rate was measured in the transverse direction of the film.

MD for sagging rate was measured in the longitudinal direction (running direction) of the film.

TD for sagging rate was measured in the transverse direction of the film.

We claim:

1. A process for the preparation of an aromatic polyimide film which comprises the steps of:
   heating an aromatic polyimide continuous film formed from a polymer soluiton wherein the polymer is produced by a polymerization reaction of a biphenyltetracarboxylic acid component and a phenylenediamine component, at a temperature of 400° to 500° C. and extending said film by applying thereto a tension of 100 to 400 g/mm² in the longitudinal direction, and then
   heating said aromatic polyimide continuous film at a temperature of 270° to 370° C. under a tension of 60 to 90 g/mm² applied in the longitudinal direction without essentially extending said film.

2. The process as claimed in claim 1. wherein said aromatic polyimide continuous film is heated at a temperature of 410° to 500° C. and said film is extended by applying thereto a tension of 150 to 300 g/mm² in the longitudinal direction in the first step, and said aromatic polyimide continuous film is heated at a temperature of 270° to 370° C. under a tension of 60 to 90 g/mm² applied in the longitudinal direction without essentially extending said film in the second step.

3. The process as claimed in 1, wherein said biphenyltetracarboxylic acid component is 3,3′,4,4′-biphenyltetracarboxylic dianhydride or 2,3,3′,4′-biphenyltetracarboxylic dianhydride.

4. The process as claimed in claim 1. wherein said phenylenediamine component is p-phenylenediamine.

5. The process as claimed in claim 1, wherein said biphenyltetracarboxylic acid component is 3,3′,4,4′-biphenyltetracarboxylic dianhydride or 2,3,3′,4′-biphenyltetracarboxylic dianhydride; and said phenylenediamine component is p-phenylenediamine.

6. The process as claimed in claim 2, wherein said biphenyltetracarboxylic acid component is 3,3′,4,4′-biphenyltetracarboxylic dianhydride or 2,3,3′,4′-biphenyltetracarboxylic dianhydride; and said phenylenediamine component is p-phenylenediamine.

7. A process for the preparation of an aromatic polyimide film which comprises the steps of:
   heating an aromatic polyimide continuous film formed from a polymer solution wherein the polymer is produced by a polymerization reaction of a biphenyltetracarboxylic acid component and a phenylenediamine component, at a temperature of 410° to 500°C. and extending said film by applying thereto a tension of 150 to 300 g/mm² in the longitudinal direction, and then heating said aromatic polyimide continuous film at a temperature of 250° to 400° C. under a tension of 50 to 100 g/mm² applied in the longitudinal direction without essentially extending said film.

8. The process as claimed in claim 7, wherein said biphenyltetracarboxylic acid component is 3,3',4,4'-biphenyltetracarboxylic dianhydride or 2,3,3',4'-biphenyltetracarboxylic dianhydride.

9. The process as claimed in claim 7, wherein said phenylenediamine component is P-phenylenediamine.

10. The process as claimed in claim 7, wherein said biphenyltetracarboxylic acid component is 3,3',4,4'-biphenyltetracarboxylic dianhydride or 2,3,3',4'-biphenyltetracarboxylic dianhydride; and said phenylenediamine component is p-phenylenediamine.

* * * * *